United States Patent
Zhi (10) Patent No.: US 9,811,057 B2
(45) Date of Patent: Nov. 7, 2017

(54) MACHINE LEARNING APPARATUS AND METHOD FOR LEARNING PREDICTED LIFE OF MOTOR, LIFE PREDICTION APPARATUS AND MOTOR SYSTEM INCLUDING MACHINE LEARNING APPARATUS

(71) Applicant: FANUC CORPORATION, Yamanashi (JP)

(72) Inventor: Chao Zhi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/247,984

(22) Filed: Aug. 26, 2016

(65) Prior Publication Data

US 2017/0063276 A1   Mar. 2, 2017

(30) Foreign Application Priority Data

Aug. 28, 2015   (JP) ................................ 2015-169443

(51) Int. Cl.
| | |
|---|---|
| *G01R 31/02* | (2006.01) |
| *G05B 13/02* | (2006.01) |
| *G06N 99/00* | (2010.01) |
| *G01R 31/34* | (2006.01) |
| *G05B 19/4062* | (2006.01) |
| *H02P 23/12* | (2006.01) |

(52) U.S. Cl.
CPC ....... *G05B 13/0265* (2013.01); *G01R 31/343* (2013.01); *G05B 19/4062* (2013.01); *G06N 99/005* (2013.01); *G05B 2219/37209* (2013.01); *G05B 2219/37285* (2013.01); *G05B 2219/42319* (2013.01); *H02P 23/12* (2013.01)

(58) Field of Classification Search
CPC ................ G01R 31/343; G06N 99/005; G05B 13/0265; G05B 19/4062; G05B 2219/37209; H02P 23/12; H02P 29/00
USPC ........ 318/490, 430, 450, 455, 471, 472, 473
See application file for complete search history.

(56) References Cited

U.S. PATENT DOCUMENTS

| | | | |
|---|---|---|---|
| 4,525,763 A | 6/1985 | Hardy et al. | |
| 5,019,760 A * | 5/1991 | Chu | ........................ G01K 1/026 318/490 |
| 6,297,742 B1 * | 10/2001 | Canada | ................ G01R 31/343 318/490 |

(Continued)

FOREIGN PATENT DOCUMENTS

| | | |
|---|---|---|
| JP | S60144127 A | 7/1985 |
| JP | 2003130048 A | 5/2003 |

(Continued)

*Primary Examiner* — Bentsu Ro
*Assistant Examiner* — Thai Dinh
(74) *Attorney, Agent, or Firm* — Hauptman Ham, LLP (57) ABSTRACT

A machine learning apparatus that learns a condition associated with a predicted life of a motor includes: a state observation unit that observes a state variable composed from at least one of output data of a sensor that detects an operation state of the motor and data relating to presence or absence of a failure in the motor; an actual life data acquisition unit that acquires data relating to an actual life of the motor; and a learning unit that learns the condition associated with the predicted life of the motor in accordance with a training data set created based on a combination of the state variable and the actual life.

12 Claims, 4 Drawing Sheets

(56) References Cited

U.S. PATENT DOCUMENTS

| | | | |
|---|---|---|---|
| 8,248,739 B2 * | 8/2012 | Farr | G01R 31/343 318/101 |
| 8,498,826 B2 * | 7/2013 | Nagathil | G05B 19/4065 318/490 |
| 8,981,697 B2 * | 3/2015 | Zeller | H02H 7/0816 318/432 |

FOREIGN PATENT DOCUMENTS

| | | |
|---|---|---|
| JP | 2006098349 A | 4/2006 |
| JP | 2007-232517 A | 9/2007 |
| JP | 2011-158479 A | 8/2011 |

\* cited by examiner

MACHINE LEARNING APPARATUS AND METHOD FOR LEARNING PREDICTED LIFE OF MOTOR, LIFE PREDICTION APPARATUS AND MOTOR SYSTEM INCLUDING MACHINE LEARNING APPARATUS

RELATED APPLICATIONS

The present application claims priority to Japanese Patent Application Number 2015-169443, filed Aug. 28, 2015, the disclosure of which is hereby incorporated by reference herein in its entirety.

BACKGROUND OF THE INVENTION

1. Field of the Invention

The present invention relates to a machine learning apparatus and a machine learning method for learning a condition associated with the predicted life of a motor, a life prediction apparatus and a motor system including the machine learning apparatus.

2. Description of the Related Art

In a field using a motor, in order to prevent reduction in operational efficiency and occurrence of a serious accident, the life of the motor is predicted, and based on the prediction result, replacement or maintenance such as repairing and mending of the motor or a component thereof is performed before the motor becomes inoperable due to the end of the life of the motor. Conventionally, the designer and user of a motor predicts the life of the motor by performing an experiment or the like. In some cases, the designer and user predict the life of the motor based on their rule of thumb.

As disclosed in, for example, Japanese Laid-open Patent Publication No. S60-144127, there is known a method for predicting the life of a motor by seeking a failure model that represents a relationship between winding temperature and winding failure rate of the motor.

Further, as disclosed in, for example, Japanese Laid-open Patent Publication No. 2006-98349, there is known a method for predicting the insulation life of an insulator provided to a rotor coil in a high voltage rotary machine.

Further, as disclosed in, for example in Japanese Laid-open Patent Publication No. 2003-130048, there is known a method for predicting the life of a rolling bearing, which is a component of a motor.

However, the life varies depending on the use environment of the motor. Thus, life prediction for the motor by an experiment sometimes lacks accuracy. Further, it takes much time and labor to reproduce an experiment depending on individual use environment to seek accuracy, and that is cumbersome. In addition, that is inefficient due to the dependence on a personal rule of thumb, and also there is a big personal difference.

SUMMARY OF INVENTION

In view of the above problem, it is an object of the present invention to provide a machine learning apparatus and method in which the life of a motor corresponding to a use environment can be predicted accurately and easily, and a life prediction apparatus and a motor system including the machine learning apparatus.

To achieve the above object, the machine learning apparatus, which learns a condition associated with the predicted life of the motor, includes: a state observation unit that observes a state variable composed from at least one of output data of a sensor that detects an operation state of the motor and a data relating to presence or absence of a failure in the motor; an actual life data acquisition unit that acquires data relating to the actual life of the motor; and a learning unit that learns the condition associated with the predicted life of the motor in accordance with a training data set defined based on a combination of the state variable and the actual life.

The above operation state may include at least one of a current command that commands a current flowing through the motor, a voltage command that commands a voltage applied to the motor, a frequency command that commands a frequency of the current or voltage flowing through the motor, a torque outputted from the motor, a number of rotations of the motor, an operating time of the motor, a temperature in a vicinity of the motor, humidity in a vicinity of the motor, and a vibration generated in the motor.

The learning unit may include a reward calculation unit that calculates a reward based on the predicted life and the actual life, and a function update unit that updates a function for calculating the predicted life of the motor based on the state variable and the reward.

The reward calculation unit may be configured to increase the reward when a ratio of the difference between the predicted life and the actual life to the actual life falls inside a specified range and reduce the reward when the ratio falls outside the specified range.

The learning unit may be configured to learn the condition in accordance with a training data set acquired with respect to a plurality of motors.

The life prediction apparatus of the motor, which includes the above machine learning apparatus, may further include a decision-making unit that calculates the predicted life of the motor based on a result of learning by the learning unit in accordance with the training data set and in response to input of the current state variable.

The life prediction apparatus may further include a notification unit that notifies an operator of the predicted life calculated by the decision-making unit.

The life prediction apparatus may further include a notification unit that notifies the operator of information that prompts replacement of the motor based on the predicted life calculated by the decision-making unit.

The life prediction apparatus may further include a change command output unit that, based on the predicted life calculated by the decision-making unit, outputs to the control device that controls the motor a change command that changes at least one of the current command that commands the current flowing through the motor, the voltage command that commands the voltage applied to the motor, and the frequency command that commands the frequency of the current or voltage flowing through the motor.

Further, the learning unit may be configured to relearn and update the above condition in accordance with an additional training data set defined by a current state variable.

Further, the motor system includes the above-described life prediction apparatus, a motor, a control device that controls the motor, and a sensor that detects an operation state of the motor.

Further, the machine learning method, which learns a condition associated with a predicted life of a motor, includes: a state observation step that observes a state variable composed from at least one of output data of a sensor that detects an operation state of the motor and a data relating to presence or absence of a failure in the motor; an actual life data acquisition step that acquires data relating to an actual life of the motor; and a learning step that learns the condition associated with the predicted life of the motor in accordance with a training data set created based on a combination of the state variable and the actual life.

BRIEF DESCRIPTION OF THE DRAWINGS

The present invention will be more clearly understood by referring to the following accompanying drawings.

DETAILED DESCRIPTION

A machine learning apparatus and method for learning a predicted life of a motor, a life prediction apparatus and a motor system including the machine learning apparatus will be described below with reference to the drawings. However, it should be understood that the present invention is not limited to the drawings or embodiments described below.

Figure 1:
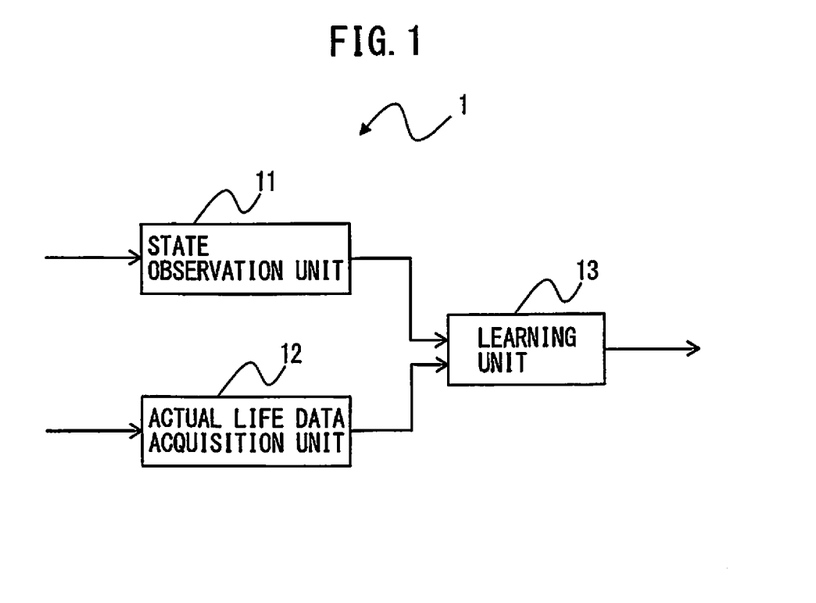
FIG. 1 is a principle block diagram of a machine learning apparatus according to an embodiment.

FIG. 1 is a principle block diagram of the machine learning apparatus according to an embodiment. It is meant hereinafter that components assigned identical reference numerals in different drawings are those having identical functions.

The machine learning apparatus 1 according to the embodiment is configured to learn a condition associated with a predicted life of a motor.

The machine learning apparatus 1 includes a state observation unit 11, an actual life data acquisition unit 12, and a learning unit 13. The machine learning apparatus 1 may be configured as a digital computer connected to the motor via a network. Alternatively, the machine learning apparatus 1 may be provided on a cloud server, wherein it is connected to a motor via a network. Alternatively, the machine learning apparatus 1 may be contained in a control device that controls the motor, wherein it performs machine learning using a processor of the control device.

The state observation unit 11 observes a state variable including at least one of output data of a sensor that detects an operation state (operational condition) of the motor and data relating to presence or absence of a failure of the motor.

The operation state of the motor detected by the sensor includes at least one of a current command that commands a current flowing through the motor, a voltage command that commands a voltage applied to the motor, a frequency command that commands a frequency of the current or voltage flowing through the motor, a torque which is outputted from the motor, a number of rotations of the motor, an operating time of the motor, a temperature in the vicinity of the motor, a humidity in the vicinity of the motor, and a vibration generated in the motor. Further, other parameters relating to the motor may be included in the operation state of the motor.

Regarding the above operation states observed as the state variable by the state observation unit 11, the current command that commands the current flowing through the motor, the voltage command that commands the voltage applied to the motor, and the frequency command that commands the frequency of the current or voltage flowing through the motor are those which the control device that controls the motor inputs to the motor (more precisely, a power converter that supplies driving power to the motor) and are generally used as internal data of a control software stored in the control device of the motor. These operation states are sometimes referred to simply as "input conditions of the motor" hereinafter.

Further, regarding the above operation states observed as the state variable by the state observation unit 11, the torque outputted from the motor, the number of rotations of the motor, and the operating time of the motor are information outputted as a result of the operation of the motor and are usually detected by various sensors. For example, the torque outputted from the motor is detected by a torque sensor, the number of rotations of the motor is detected by a rotation sensor, and the operating time of the motor is detected by an operating time measurement device (timepiece sensor). These operation states will sometimes be referred to simply as "output conditions of the motor" hereinafter. Meanwhile, regarding the above-mentioned input conditions of the motor, the current flowing through the motor, the voltage applied to the motor, and the frequency of the current or voltage flowing through the motor, which result from the current command, voltage command, and frequency command by the control device of the motor, may be detected by a current sensor, a voltage sensor, and a frequency sensor, respectively, and in this case, these parameters may be included in the operation states as the "output conditions of the motor".

Further, regarding the above operation states observed as the state variable by the state observation unit 11, a temperature in the vicinity of the motor, a humidity in the vicinity of the motor, and a vibration generated in the motor are information representing states of the environment in which the motor is installed. The information also externally have an influence on the operation and life of the motor. For example, the temperature in the vicinity of the motor is measured by a temperature sensor (thermometer), the humidity in the vicinity of the motor is measured by a humidity sensor (hygrometer), and the vibration generated in the motor is measured by a vibration sensor (vibrometer). These operation states are sometimes referred to simply as "external conditions of the motor" hereinafter.

Further, data relating to presence or absence of a failure of the motor observed by the state observation unit 11 may be generated by a failure detection device mounted on the motor, for example. In this instance, the failure detection device outputs data representing the occurrence of a failure in the motor when a disturbance torque detected by the torque sensor or amplitude of a vibration detected by the vibration sensor exceeds a predetermined threshold value. Alternatively, data relating to presence or absence of a failure of the motor observed by the state observation unit 11 may be generated based on internal data of control software stored in the control device of the motor. Alternatively, it may be configured such that the designer or user, who have found or determined a failure of the motor, input data representing the occurrence of the failure in the motor to the state observation unit 11.

As described above, the state observation unit 11 observes a state variable including at least one of output data of a sensor that detects the operation states of the motor (input condition, output condition and external condition of the motor) and data relating to presence or absence of a failure in the motor. In case that the machine learning apparatus 1 is connected to the motor via a network or provided on a cloud server, the state observation unit 11 observes the state variable via the network. Alternatively, in case that the machine learning apparatus 1 is contained in the control device that controls the motor, the state observation unit 11 observes the state variable based on internal data of a control software stored in the control device or sensor data outputted from various sensors connected to the control device.

The actual life data acquisition unit 12 acquires data relating to an actual life of the motor. For example, the actual life of the motor is obtained by measuring a time from when the motor starts to be used to when actually the life ends (or to when a failure occurs), and for example, the designer or user inputs data relating to the actual life measured to the actual life data acquisition unit 12. Alternatively, in a system in which a timer is installed in an apparatus that performs control and drive of the motor, the operating time of the motor may be integrated to be input to the actual life data acquisition unit 12.

The learning unit 13 learns the predicted life of the motor in accordance with a training data set defined based on a combination of the state variable observed by the state observation unit 11 and the actual life acquired by the actual life data acquisition unit 12. Meanwhile, a training data set may be acquired with respect to a plurality of motors, and in this instance, the learning unit 13 learns the predicted life of the motor in accordance with the training data set acquired with respect to the plurality of motors.

Figure 2:
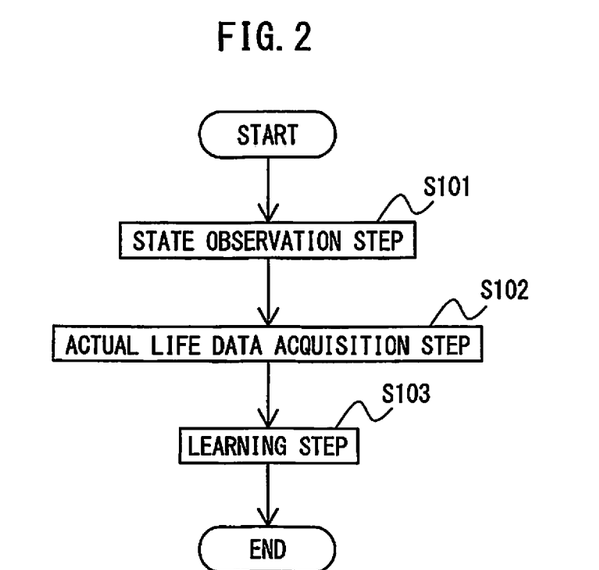
FIG. 2 is a flow chart illustrating an operation flow of a machine learning method according to an embodiment.

FIG. 2 is a flow chart illustrating an operation flow of the machine learning method according to the embodiment. The machine learning method that learns a condition associated with a predicted life of a motor includes a state observation step S101, an actual life data acquisition step S102, and a learning step S103.

The state observation step S101 is performed by the state observation unit 11, i.e., to observe a state variable including at least one of output data of a sensor that detects an operation state of the motor, and data relating to presence or absence of a failure in the motor.

The actual life data acquisition step S102 is performed by the actual life data acquisition unit 12, i.e., to acquire data relating to an actual life of the motor.

Meanwhile, the process of step S101 and the process of step S102 described above may be performed arbitrarily in replacement with each other.

The learning step S103 is performed by the learning unit 13 to learn a predicted life of the motor in accordance with a training data set defined based on a combination of a state variable observed by the state observation unit 11 and an actual life acquired by the actual life data acquisition unit 12.

The learning unit 13 may use any type of learning algorithm. By way of example only, a case is described in which reinforcement learning is applied.

Reinforcement learning is such that an agent (acting subject) in a given environment observes a current state and determines an action to take. The agent obtains a reward from the environment by selecting an action, and learns a way that the most reward can be obtained through a series of actions. Q-learning and TD-learning are known as a typical technique of reinforcement learning. For example, in the case of Q-learning, a general update formula (action value table) for an action-value function Q(s,a) is represented by the following formula (1):

$$Q(s_t, a_t) \leftarrow Q(s_t, a_t) + \alpha\left(r_{t+1} + \gamma \max_a Q(s_{t+1}, a) - Q(s_t, a_t)\right) \quad (1)$$

In formula (1), $s_t$ represents an environment at a time t, and $a_t$ represents an action at the time t. The action $a_t$ results in the environment being changed to $s_{t+1}$. $r_{t+1}$ represents a reward that can be got by virtue of the change of the environment, $\gamma$ represents a discount rate, and $\alpha$ represents a learning factor. When Q-learning is applied, depending on predicted life, the action $a_t$ is pertinent to the predicted life that leads to replacement and/or maintenance of the motor or a component(s) thereof.

Figure 3:
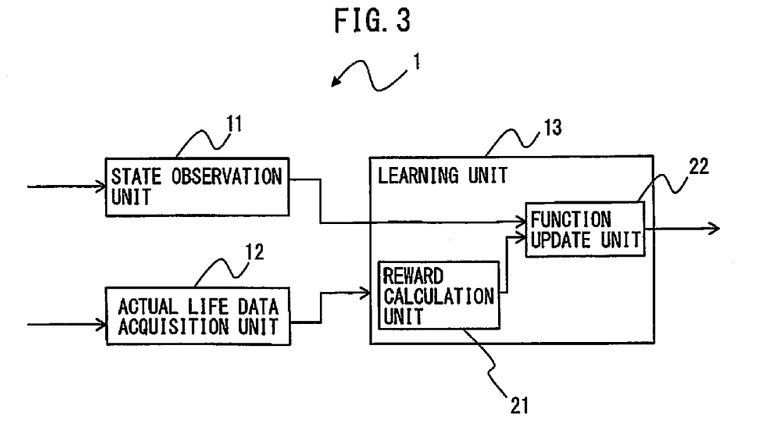
FIG. 3 is a principle block diagram of a machine learning apparatus using reinforcement learning according to an embodiment.

FIG. 3 is a principle block diagram of the machine learning apparatus using reinforcement learning according to the embodiment. The learning unit 13 includes a reward calculation unit 21 and a function update unit 22. The reward calculation unit 21 calculates a reward based on a predicted life determined by a decision-making unit and an actual life acquired by the actual life data acquisition unit 12. The function update unit 22 updates a function for calculating a predicted life of the motor, based on the state variable observed by the state observation unit 11 and the reward calculated by the reward calculation unit 21. For example, in the case of Q-learning, the action-value function Q(s, a) represented by formula (1) is used as a function for changing the predicted life which is the action $a_t$. Meanwhile, components other than these are similar to the components illustrated in FIG. 1, and therefore, identical components are assigned identical reference numerals, a detailed description of which is omitted.

Figure 4:
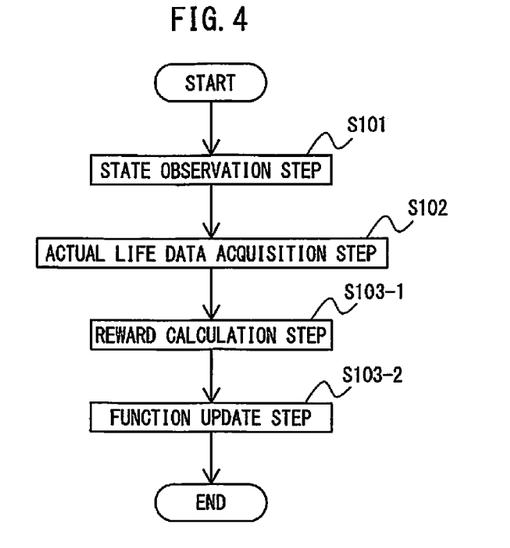
FIG. 4 is a flow chart illustrating an operation flow of a machine learning method using reinforcement learning according to an embodiment.

FIG. 4 is a flow chart illustrating an operation flow of the machine learning method using reinforcement learning according to the embodiment.

Firstly, at the state observation step S101, the state observation unit 11 observes a state variable including at least one of output data of the sensor that detects an operation state of the motor and data relating to presence or absence of a failure in the motor.

Subsequently, at the actual life data acquisition step S102, the actual life data acquisition unit 12 acquires data relating to an actual life of the motor.

Meanwhile, the process of the step S101 and the process of the step S102 may be performed arbitrarily in exchange for each other.

Subsequently, at reward calculation step S103-1, the reward calculation unit 21 calculates a reward based on a predicted life determined by a decision-making unit and an actual life acquired by the actual life data acquisition unit 12.

Subsequently, at function update step S103-2, the function update unit 22 updates a function for calculating the predicted life of the motor, based on the state variable observed by the state observation unit 11 and the reward calculated by the reward calculation unit 21.

Next, description will be made of a life prediction apparatus for the motor including the above-described machine learning apparatus. By way of example only, a case is described in which reinforcement learning is used as a learning algorithm of the learning unit.

Figure 5:
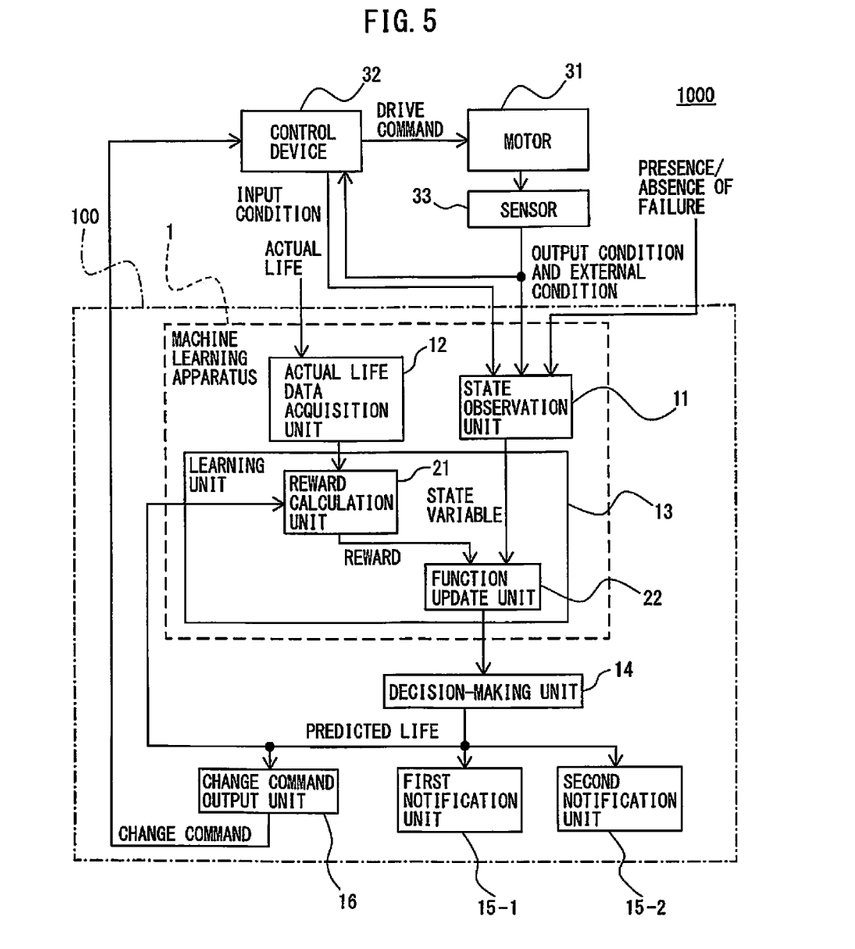
FIG. 5 is a principle block diagram illustrating a life prediction apparatus including the machine learning apparatus according to the embodiment, and a motor system including the life prediction apparatus.

FIG. 5 is a principle block diagram illustrating a life prediction apparatus including the machine learning apparatus according to the embodiment and a motor system including the life prediction apparatus. A case is described herein in which a motor 31 is controlled by a control device 32.

The life prediction apparatus 100 for the motor 31 includes a machine learning apparatus 1, a decision-making unit 14, a first notification unit 15-1, a second notification unit 15-2, and a change command output unit 16. Meanwhile, the first notification unit 15-1 and the second notification unit 15-2 may be implemented as a single notification unit as described hereinafter. Although not illustrated herein, a data output unit may be separately provided which outputs data relating to a predicted life determined by the decision-making unit 14.

Further, the motor system 1000 includes the life prediction apparatus 100, the motor 31, the control device 32, and a sensor 33.

The type of the motor 31 does not limit the present invention, and may be either an AC motor or a DC motor.

The control device 32 controls the motor 31, based on a control software stored in the interior of the control device 32, by using various data detected by the sensor 33. A drive command for controlling the motor 31 includes a current command that commands a current flowing through the motor 31, a voltage command that commands a voltage applied to the motor 31, a frequency command that commands the frequency of the current or voltage flowing through the motor 31, or the like. The method for controlling the motor 31 by the control device 32 does not particularly limit the present invention, but may be a well-known control method.

The sensor 33 detects an operation state of the motor 31. For example, there are a torque sensor that detects a torque outputted from the motor 31, a rotation sensor that detects a number of rotations of the motor 31, an operating time measurement device (timepiece sensor) that detects an operating time of the motor 31, a current sensor that detects a current flowing through the motor 31, a voltage sensor that detects a voltage applied to the motor 31, a frequency sensor that detects a frequency of a current or voltage flowing through the motor 31, a power sensor that detects a driving power supplied to the motor 31, a temperature sensor (thermometer) that measures a temperature in the vicinity of the motor 31, a humidity sensor (hygrometer) that measures a humidity in the vicinity of the motor 31, a vibration sensor that measures a vibration generated in the motor 31, and so forth. The sensor 33 detects the ones referred to as output condition and external condition of the above-described operation states of the motor 31.

The machine learning apparatus 1 includes a state observation unit 11, an actual life data acquisition unit 12, and a learning unit 13.

As described above, the state observation unit 11 observes a state variable including at least one of output data of the sensor that detects an operation state of the motor 31 and data relating to presence or absence of a failure in the motor 31. Regarding the operation states observed as a state variable, for example, the state observation unit 11 acquires the operation states as output condition and external condition from the sensor 33, and acquires the operation states as input condition from the control device 32. Further, regarding data relating to presence or absence of a failure in the motor 31, as described above, the state observation unit 11 may acquire such data from a failure detection device (not illustrated) provided in the motor 31 or from the control device 32, or alternatively may acquire such data via an input operation by the designer and user who have found or determined a failure in the motor 31.

The actual life data acquisition unit 12 acquires data relating to an actual life of the motor 31.

The learning unit 13 includes a reward calculation unit 21 and a function update unit 22, and learns a predicted life of the motor 31 in accordance with a training data set defined based on a combination of the state variable observed by the state observation unit 11 and the actual life acquired by the actual life data acquisition unit 12.

The reward calculation unit 21 in the learning unit 13 calculates a reward based on the predicted life determined by the decision-making unit 14 and the actual life acquired by the actual life data acquisition unit 12. Specifically, the reward calculation unit 21 increases the reward when $|N-M|/M$, i.e., a ratio of the difference between the predicted life N and the actual life M to the actual life M falls inside a specified range $\alpha$, while it reduces the reward when the ratio falls outside the range $\alpha$. The term $|N-M|$ represents the absolute value of the difference between the predicted life N and the actual life M. The reason why the reward is calculated in this manner is because it means that the smaller $|N-M|/M$, which is the ratio of the difference between the predicted life N and the actual life M to the actual life M, the more accurately the predicted life can be calculated via learning by the machine learning apparatus 1. The above specified range $\alpha$ is a reward judgment factor, which may arbitrarily be set up based on the accuracy of the predicted life obtained as a result of learning by the machine learning apparatus 1 or the like.

The function update unit 22 in the learning unit 13 updates the function for calculating the predicted life of the motor 31, based on the state variable observed by the state observation unit 11 and the reward calculated by the reward calculation unit 21. For example, in the case of Q-learning, the action-value function $Q(s, a)$ represented by formula (1) is used as the function for changing the predicted life which is the action $a_r$.

The decision-making unit 14 calculates the predicted life of the motor 31 based on the result of learning by the learning unit 13 in accordance with the training data set and in response to input of the current state variable. In this embodiment, since, by way of example only, reinforcement learning is used as a learning algorithm, the function update unit 22 in the learning unit 13 updates the function for calculating the predicted life, based on the reward calculated by the reward calculation unit 21 in the learning unit 13, and based on the updated function, the decision-making unit 14 selects and outputs the predicted life that the most reward is obtained. The predicted life determined by the decision-making unit 14 is outputted to the reward calculation unit 21, the first notification unit 15-1, the second notification unit 15-2, and the change command output unit 16. The reward calculation unit 21 calculates the reward, as described above, based on the predicted life determined by the decision-making unit 14 and the actual life acquired by the actual life data acquisition unit 12.

The first notification unit 15-1 notifies the operator of the predicted life calculated by the decision-making unit 14, and the second notification unit 15-2 notifies the operator of information that prompts replacement of the motor based on the predicted life calculated by the decision-making unit 14. Incidentally, the first notification unit 15-1 and the second notification unit 15-2 may be implemented as a single notification unit. In this manner, the designer and operator can be aware of the predicted life of the motor 31, and thus can perform replacement or maintenance such as repairing and mending of the motor 31 or a component thereof before the motor 31 becomes inoperable. By performing replacement or maintenance of the component or components of the motor 31, it is possible to extend the life of the motor 31. Alternatively, it may be configured such that the operation states (input condition, output condition, and external condition) acquired in calculation of the predicted life and having a great influence on the life of the motor 31 are notified together as the contents of notification of the first notification unit 15-1 and/or the second notification unit 15-2. For example, it may be considered that when "torque $T_A$, a number of rotations $S_A$, operating time $t_A$" is set as an output condition A and "torque $T_B$, a number of rotations $S_B$, operating time $t_B$" is set as an output condition B while the operator processes an object using the motor 31, the decision-making unit 14 calculates a predicted life with respect to these output conditions A and B and presents the one of the output conditions for which the predicted life is longer to the operator. In this manner, the designer and operator can change the operation state that influences the life of the motor 31. For example, when finding that temperature and humidity influence the life of the motor 31, the designer and operator can take measures to prepare the surrounding environment of the motor 31 such that the temperature and humidity become appropriate to extend the life of the motor 31.

The first notification unit 15-1 and the second notification unit 15-2 may, for example, be a display of a personal computer, a portable terminal or a touch panel or a display attached to the control device 32, wherein for example, the predicted life can be displayed by a character or a graphic. Further, for example, the first notification unit 15-1 and the second notification unit 15-2 may be implemented by an audio device that produces a sound, such as a speaker, a buzzer or a chime. Alternatively, the first notification unit 15-1 and the second notification unit 15-2 may take a form that effects displaying by printing on a paper surface or the like using a printer. Further, alternatively, the notification units may be implemented by appropriately combining the above features.

Based on the predicted life calculated by the decision-making unit 14, the change command output unit 16 outputs to the control device 32 for controlling the motor 31 change commands, which change at least one of the current command that commands the current flowing through the motor 31, the voltage command that commands the voltage applied to the motor 31, and the frequency command that commands the frequency of the current or voltage flowing through the motor 31. As described above, the current command that commands the current flowing through the motor 31, the voltage command that commands the voltage applied to the motor 31, and the frequency command that commands the frequency of the current or voltage flowing through the motor 31 are those referred to as input conditions of the motor 31. When the predicted life is calculated, the change command output unit 16 can grasp the voltage command, the current command or the frequency command, which have a great influence on the life of the motor 31, and thus outputs, based thereon, the change command to the control device 32.

Figure 6:
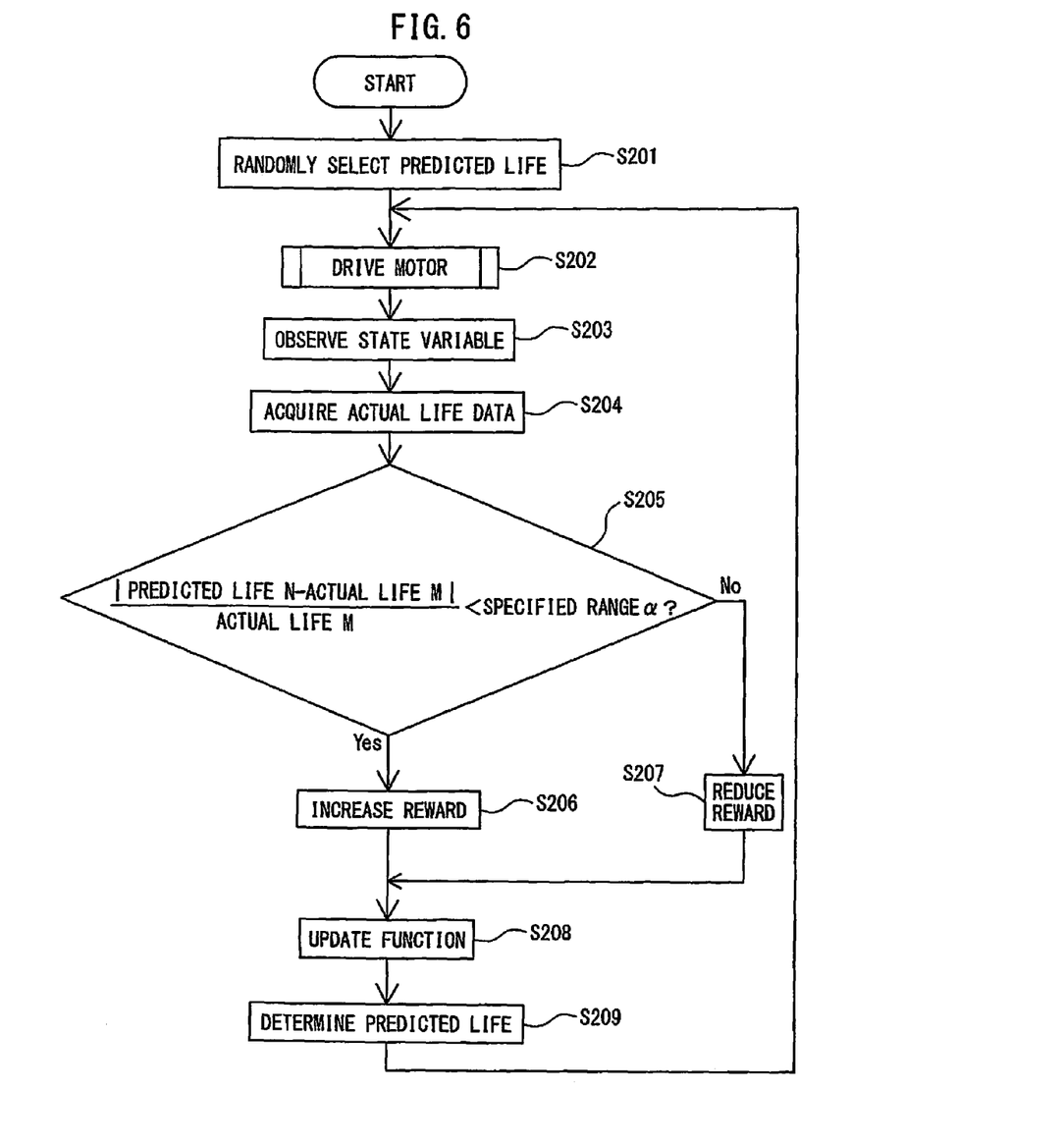
FIG. 6 is a flow chart illustrating an operation flow of the life prediction apparatus including the machine learning apparatus using reinforcement learning according to the embodiment.

FIG. 6 is a flow chart illustrating an operation flow of the life prediction apparatus including the machine learning apparatus using reinforcement learning according to the embodiment.

Generally, in reinforcement learning, an initial value for an action is randomly selected. In the embodiment, at step S201, the predicted life, which is an action, is randomly selected.

At step S202, the control device 32 controls the motor 31, based on a control software stored in the interior of the control device 32, by using various data detected by the sensor 33. The motor 31 is driven under the control by the control device 32. During this, the sensor 33 detects the ones referred to as output condition and external condition of the above-described operation states of the motor 31.

At step S203, the state observation unit 11 observes a state variable composed from at least one of output data of a sensor that detects an operation state of the motor 31 and data relating to presence or absence of a failure in the motor 31.

Then, at an actual life data acquisition step S204, the actual life data acquisition unit 12 acquires data relating to the actual life of the motor.

Incidentally, the process of step S203 and the process of step S204 described above may be performed arbitrarily in replacement with each other.

Subsequently, at step S205, the state observation unit 11 determines whether or not the ratio of the difference between the predicted life N and the actual life M to the actual life M, i.e., $|N-M|/M$ falls inside the specified range $\alpha$. When it is determined that "$|N-M|/M$", which is the ratio of the difference between the predicted life N and the actual life M to the actual life M, falls inside the specified range $\alpha$, the reward calculation unit 21 increases the reward at step S206. Meanwhile, when it is determined that "$|N-M|/M$", which is the ratio of the difference between the predicted life N and the actual life M to the actual life M, does not fall within the specified range $\alpha$, the reward calculation unit 21 reduces the reward at step S207.

At step S208, the function update unit 22 updates the function for calculating the predicted life of the motor 31, based on the state variable observed by the state observation unit 11 and the reward calculated by the reward calculation unit 21.

At subsequent step S209, the decision-making unit 14 selects and outputs the predicted life of the motor 31 for which the most reward is obtained based on the function updated at step S208. The predicted life determined by the decision-making unit 14 is outputted to the reward calculation unit 21, the first notification unit 15-1, the second notification unit 15-2, and the change command output unit 16. Then, the process returns to step S202, and henceforth, the processes of steps S202 to S209 are performed repetitively. In this manner, the machine learning apparatus 1 proceeds to learn the predicted life. Incidentally, the training data set may be acquired from a plurality of motors 31, and in such an instance, the learning unit 13 performs the processes of steps S201 to S209 repetitively in accordance with the training data set acquired with respect to the plurality of motors 31, and proceeds to learn the predicted life. When the training data set is acquired with respect to the plurality of motors 31, the learning accuracy of the machine learning apparatus 1 is enhanced.

Incidentally, the above-described state observation unit 11, actual life data acquisition unit 12, learning unit 13, and decision-making unit 14 may be constructed, for example, in the form of a software program, or alternatively may be constructed in a combination of various electronic circuits and a software program. For example, when they are constructed in the form of a software program, the function of each of the above units can be implemented by causing an arithmetic processing unit in the control device 32 of the motor 31 to operate in accordance with the software program or causing the software program to run on a cloud server. Alternatively, the machine learning apparatus 1 including the state observation unit 11, the actual life data acquisition unit 12, and the learning unit 13 may be implemented as a semiconductor integrated circuit in which a software program for realizing the function of each unit is written. Alternatively, a semiconductor integrated circuit in which a software program for realizing the function of each unit is written may be implemented in a form that includes not only the machine learning apparatus 1 including the state observation unit 11, the actual life data acquisition unit 12 and the learning unit 13 but also the decision-making unit 14.

Further, since the machine learning process 1 is performed using data detected by a sensor which is originally incorporated in the control device 32 for drive-controlling the motor 31, there is no need to separately provide a new hardware device, and thus a retrofit application to the existing motor control device is also possible. In this case, a semiconductor integrated circuit in which a software program that realizes the function of each unit of the machine learning apparatus 1 and the decision-making unit 14 is written may be incorporated in the existing motor control device, or a software program per se that realizes the function of each unit of the machine learning apparatus 1 and the decision-making unit 14 may be additionally installed in an arithmetic processing unit in the existing motor control device. Further, it may be configured such that the machine learning apparatus 1 which has learned the predicted life with respect to a given motor 31 is attached to a separate motor control device, thereby relearning and updating the predicted life with respect to the separate motor control device.

According to the present invention, it is possible to achieve a machine learning apparatus and method capable of accurately and easily predicting the life of the motor corresponding to the use environment, and a life prediction apparatus including the machine learning apparatus and a motor system.

According to the machine learning apparatus and method of the present invention, a predicted life is learned while the motor is actually operated, so that an accurate predicted life corresponding to an actual use environment is learned. Further, according to the life prediction apparatus including the machine learning apparatus and the motor system of the present invention, it is possible to calculate an accurate predicted life corresponding to an actual use environment. In this manner, the designer and operator can be aware of the accurate predicted life of the motor, and thus can perform replacement or maintenance such as repairing and mending of the motor or a component or components thereof before the motor becomes inoperable due to the end of the life of the motor. By performing replacement or maintenance of the component or components of the motor, it is possible to extend the life of the motor. Further, the designer and operator can be aware of the operation state that has a great influence on the life of the motor acquired when calculating the predicted life, and thus can take measures to change the operation state that influences the life of the motor. Further, it is also possible to directly command the control device of the motor to change the operation state that influences the life of the motor.

What is claimed is:

1. A machine learning apparatus that learns a condition associated with a predicted life of a motor, the machine learning apparatus comprising:
    a state observation unit that observes a state variable composed from at least one of output data of a sensor that detects an operation state of the motor and data relating to presence or absence of a failure in the motor;
    an actual life data acquisition unit that acquires data relating to an actual life of the motor; and
    a learning unit that learns the condition associated with the predicted life of the motor in accordance with a training data set created based on a combination of the state variable and data relating to the actual life.

2. The machine learning apparatus according to claim 1, wherein the operation state comprises at least one of a current command that commands a current flowing through the motor, a voltage command that commands a voltage applied to the motor, a frequency command that commands a frequency of the current or voltage flowing through the motor, a torque outputted from the motor, a number of rotations of the motor, an operating time of the motor, a temperature in a vicinity of the motor, humidity in a vicinity of the motor, and vibrations generated in the motor.

3. The machine learning apparatus according to claim 1, wherein the learning unit comprises:
    a reward calculation unit that calculates a reward based on the predicted life and the actual life; and
    a function update unit that updates a function for calculating the predicted life of the motor based on the state variable and the reward.

4. The machine learning apparatus according to claim 3, wherein the reward calculation unit increases the reward when a ratio of a difference between the predicted life and the actual life to the actual life falls inside a specified range and reduces the reward when the ratio falls outside the specified range.

5. The machine learning apparatus according to claim 1, wherein the learning machine is configured to learn the condition in accordance with the training data set acquired with respect to a plurality of the motors.

6. A life prediction apparatus for the motor comprising the machine learning apparatus according to claim 1, further comprising:
    a decision-making unit that calculates the predicted life of the motor based on a result of learning by the learning unit in accordance with the training data set and in response to input of the current state variable.

7. The life prediction apparatus according to claim 6, further comprising a notification unit that notifies an operator of the predicted life calculated by the decision-making unit.

8. The life prediction apparatus according to claim 6, further comprising a notification unit that notifies an operator of information that prompts replacement of the motor based on the predicted life calculated by the decision-making unit.

9. The life prediction apparatus according to claim 6, further comprising a change command output unit that based on the predicted life calculated by the decision-making unit, outputs to a control device that controls the motor a change command that changes at least one of the current command that commands the current flowing through the motor, the voltage command that commands the voltage applied to the motor, and the frequency command that commands the frequency of the current or voltage flowing through the motor.

10. The life prediction apparatus according to claim 6, wherein the learning unit is configured to relearn and update the condition in accordance with additional training data set defined by the current state variable.

11. A motor system, comprising:
- the life prediction apparatus according to claim 6;
- a motor;
- a control device that controls the motor; and
- a sensor that detects an operation state of the motor.

12. A machine learning method that learns a condition associated with a predicted life of a motor, comprising:
- a state observation step that observes a state variable composed from at least one of output data of a sensor that detects an operation state of the motor and data relating to presence or absence of a failure in the motor;
- an actual life data acquisition step that acquires data relating to an actual life of the motor; and
- a learning step that learns the condition associated with the predicted life of the motor in accordance with a training data set created based on a combination of the state variable and data relating to the actual life.

* * * * *